United States Patent
Chiu (10) Patent No.: US 9,436,023 B2
(45) Date of Patent: Sep. 6, 2016

(54) OPERATIONAL AMPLIFIER

(71) Applicant: NOVATEK Microelectronics Corp., Hsin-Chu (TW)

(72) Inventor: Wei-Ta Chiu, New Taipei (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 14/549,553

(22) Filed: Nov. 21, 2014

(65) Prior Publication Data
US 2015/0333714 A1    Nov. 19, 2015

(30) Foreign Application Priority Data

May 15, 2014    (TW) .............................. 103117201 A (51) Int. Cl.
*H03F 3/45*        (2006.01)
*G02F 1/133*       (2006.01)
*H03F 3/30*        (2006.01)

(52) U.S. Cl.
CPC ........... *G02F 1/133* (2013.01); *G02F 1/13306* (2013.01); *H03F 3/3022* (2013.01); *H03F 3/45179* (2013.01); *H03F 3/45183* (2013.01); *H03F 2200/366* (2013.01); *H03F 2203/45154* (2013.01); *H03F 2203/45702* (2013.01)

(58) Field of Classification Search
CPC ........................................................ H03F 3/45
USPC ........................................ 330/261, 253, 263
See application file for complete search history.

(56) References Cited

U.S. PATENT DOCUMENTS

| | | | | |
|---|---|---|---|---|
| 4,743,954 A * | 5/1988 | Brown | ................ | G01N 27/4148 257/253 |
| 4,885,477 A * | 12/1989 | Bird | .................... | H03F 3/45076 323/316 |
| 5,734,296 A * | 3/1998 | Dotson | ................. | H03F 3/3067 330/253 |
| 5,764,101 A * | 6/1998 | Archer | ................ | H03F 3/45192 330/253 |
| 6,140,877 A | 10/2000 | Forbes | | |
| 6,380,806 B1 * | 4/2002 | Ang | ..................... | H03F 3/45188 330/258 |
| 6,509,795 B1 * | 1/2003 | Ivanov | ................ | H03F 3/45735 330/253 |
| 6,635,857 B1 * | 10/2003 | Kindt | ................... | H04N 5/3575 250/208.1 |
| 8,470,164 B2 * | 6/2013 | Rothberg | ............. | B01J 19/0046 205/789 |
| 2001/0045602 A1 * | 11/2001 | Maeda | ................. | H01L 27/1203 257/347 |
| 2006/0033562 A1 * | 2/2006 | Yang | ....................... | H03F 1/223 330/98 |
| 2011/0148389 A1 * | 6/2011 | Bohannon | ................. | G05F 3/30 323/313 |

(Continued)

OTHER PUBLICATIONS

Griffith, R.; Vyne, R.; Dotson, R.; Petty, T., "A 1V BiCMOS rail-to-rail amplifier with n-channel depletion-mode input-stage." in Solid-State Circuits Conference, 1997. Digest of Technical Papers. 43rd ISSCC., 1997 IEEE International, vol., No., pp. 352-353, Feb. 8-8, 1997.

(Continued)

*Primary Examiner* — Patricia T Nguyen
(74) *Attorney, Agent, or Firm* — Winston Hsu; Scott Margo (57) ABSTRACT

An operational amplifier comprises a first metal-oxide-semiconductor field effect transistor (MOSFET), comprising a first drain, a first gate and a first source; a second MOSFET, comprising a second drain, a second gate and a second source, the second source coupled to the first source of the first MOSFET; and a bias source, coupled between a first specific level and the first source of the first MOSFET and the second source of the second MOSFET; wherein the first MOSFET and the second MOSFET are depletion-type.

3 Claims, 8 Drawing Sheets

(56) References Cited

U.S. PATENT DOCUMENTS

2012/0032733 A1* 2/2012 Negoro .................. G06F 1/28
327/537
2014/0118034 A1* 5/2014 Lemkin .................. G05F 3/24
327/143

OTHER PUBLICATIONS

Deng Liang; Deng Hong-hui; Yin Yong-sheng; Zhang Guomin, "1-V rail to rail constant trans-conductance operation amplifer," in Electronic Measurement & Instruments, 2009. ICEMI '09 9th International Conference on, vol., No., pp. 2-798-2-801, Aug. 16-19, 2009.

Hati, M.K.; Bhattacharyya, T.K., "A power efficient and constant-gm 1.8 V CMOS operational Transconductance amplifier with rail-to-rail input and output ranges for charge pump in phase-locked loop," in Devices, Circuits and Systems (ICDCS), 2012 International Conference on, vol., No., pp. 38-43, Mar. 15-16, 2012.

* cited by examiner

OPERATIONAL AMPLIFIER

BACKGROUND OF THE INVENTION

1. Field of the Invention

The present invention relates to an operational amplifier, and more particularly, to an operational amplifier utilizing depletion-type metal-oxide-semiconductor field effect transistors (MOSFETs) as an input pair, and capable of only utilizing an input pair to achieve a rail to rail output voltage and reduce circuit area.

2. Description of the Prior Art

An operational amplifier is a widely used element for realizing a variety of circuit functions. Taking driving circuits of a liquid crystal display (LCD) for example, the operational amplifier can be used as an output buffer, which charges or discharges loading ends, i.e. liquid crystals, according to analog signals outputted by a front stage digital to analog converter (DAC), for driving corresponding pixel units on the LCD.

In a conventional driver chip, the operational amplifier generally has a two-stage structure, which includes a first stage amplification circuit (input stage) and a second stage output circuit (output stage). The first stage amplification circuit is utilized for increasing current or voltage gain of the operational amplifier, while the second stage output circuit is utilized for driving capacitive or resistive loads connected to the operational amplifier. In addition, since the operational amplifier may suffer loop instability problems, Miller compensation capacitors are commonly implemented to perform frequency compensation for improving loop stability.

Figure 1A:
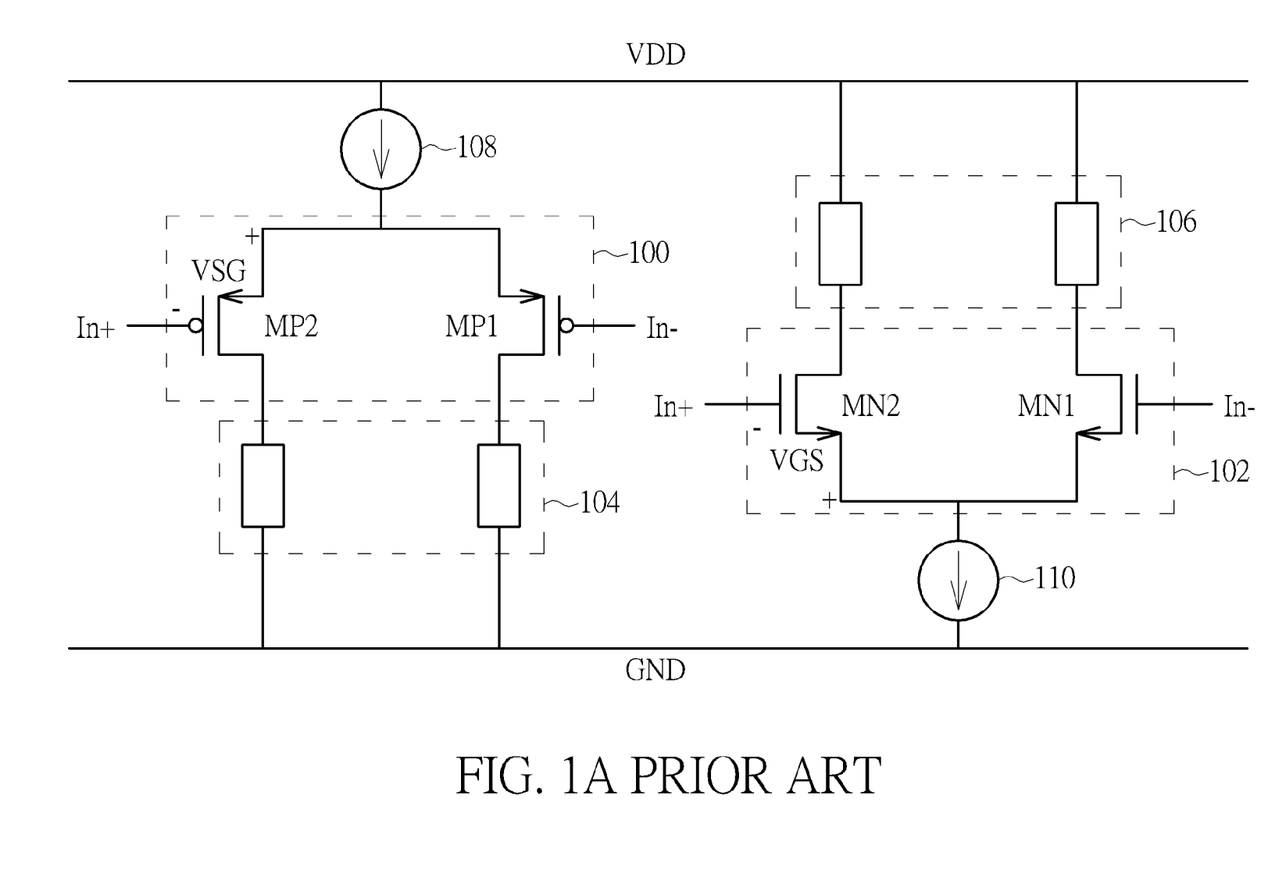
FIG. 1A is a schematic diagram of a part of a conventional operational amplifier.
Figure 1B:
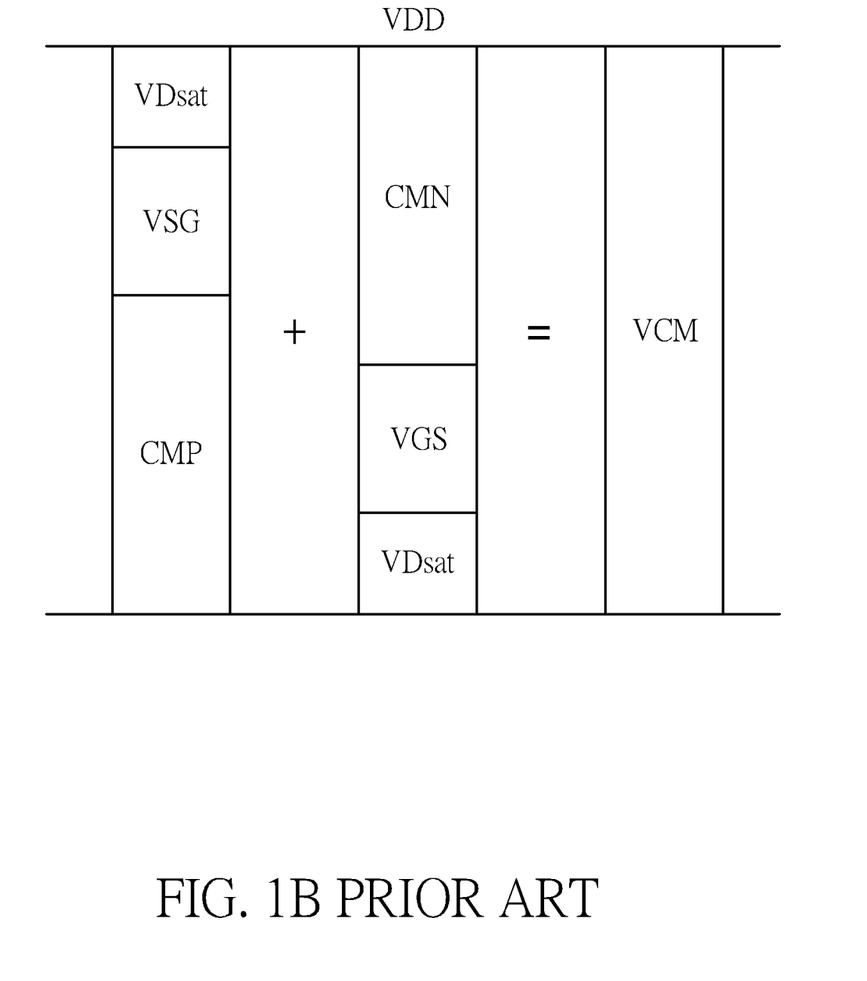
FIG. 1B is a schematic diagram of an operating voltage of the operational amplifier shown in FIG. 1A.

Besides, since a P-channel input pair and an N-channel input pair can only respectively adapt to different specific operating voltage ranges, and thus the conventional operational amplifier usually utilizes both the P-channel input pair and the N-channel input pair as an input stage to achieve a rail to rail output voltage. For example, please refer to FIG. 1A and FIG. 1B. FIG. 1A is a schematic diagram of a part of a conventional operational amplifier 10, and FIG. 1B is a schematic diagram of an operating voltage of the operational amplifier 10 shown in FIG. 1A. As shown in FIG. 1A, the operational amplifier 10 includes input pairs 100, 102, active loads 104, 106 and bias sources 108, 110, wherein the P-channel input pair 100 includes P-channel enhancement-type MOSFETs MP1, MP2 and the N-channel input pair 102 includes N-channel enhancement-type MOSFETs MN1, MN2, and the input pairs 100, 102 receives input voltages In+, In− for the operational amplifier 10 to generate an output voltage accordingly.

In such a situation, as shown in FIG. 1A and FIG. 1B, if the transistor MP2 is intended to be turned on, a system voltage VDD minus a turned on voltage VDsat of the bias source 108 and an inverse number of a threshold voltage of the transistor MP2 need to be greater than the input voltage In+ (i.e. the threshold voltage of the P-channel enhancement-type transistor is a gate-to-source voltage and a negative value, and thus a source-to-gate voltage VSG need to be greater than the inverse number of the threshold voltage for the P-channel enhancement-type transistor to be turned on), and the transistor MP1 requires the same operating condition. Therefore, the P-channel input pair 100 can only be turned on in a range CMP; similarly, if transistor MN2 is intended to be turned on, the input voltage In+ minus a threshold voltage of the transistor MN2 and a turned on voltage VDsat of the bias source 110 should be greater than a ground voltage level GND, i.e. 0V (i.e. the threshold voltage of the N-channel enhancement-type transistor is a gate-to-source voltage and positive value, and thus a gate-to-source voltage VGS need to be greater than the threshold voltage for the N-channel enhancement-type transistor to be turned on), and the transistor MN1 requires the same operating condition. Therefore, the N-channel input pair 102 only can only be turned on in a range CMN. As a result, since the operational amplifier 10 includes both the P-channel input pair 100 and the N-channel input pair 102 for the ranges CMP, CMN, the operational amplifier 10 can operate in a full range VCM and achieve a rail to rail output voltage.

However, the conventional operational amplifier 10 needs to include both the P-channel input pair 100 and the N-channel input pair 102, and requires larger circuit area. Therefore, there is a need for improvement of the prior art.

SUMMARY OF THE INVENTION

It is therefore an objective of the present invention to provide an operational amplifier utilizing depletion-type metal-oxide-semiconductor field effect transistors (MOSFETs) as an input pair, and capable of only utilizing an input pair to achieve a rail to rail output voltage and reduce circuit area.

An operational amplifier includes a first metal-oxide-semiconductor field effect transistor (MOSFET), including a first drain, a first gate and a first source; a second MOSFET, comprising a second drain, a second gate and a second source, the second source coupled to the first source of the first MOSFET; and a bias source, coupled between a first specific level and the first source of the first MOSFET and the second source of the second MOSFET; wherein the first MOSFET and the second MOSFET are depletion type.

These and other objectives of the present invention will no doubt become obvious to those of ordinary skill in the art after reading the following detailed description of the preferred embodiment that is illustrated in the various figures and drawings.

DETAILED DESCRIPTION

Figure 2A:
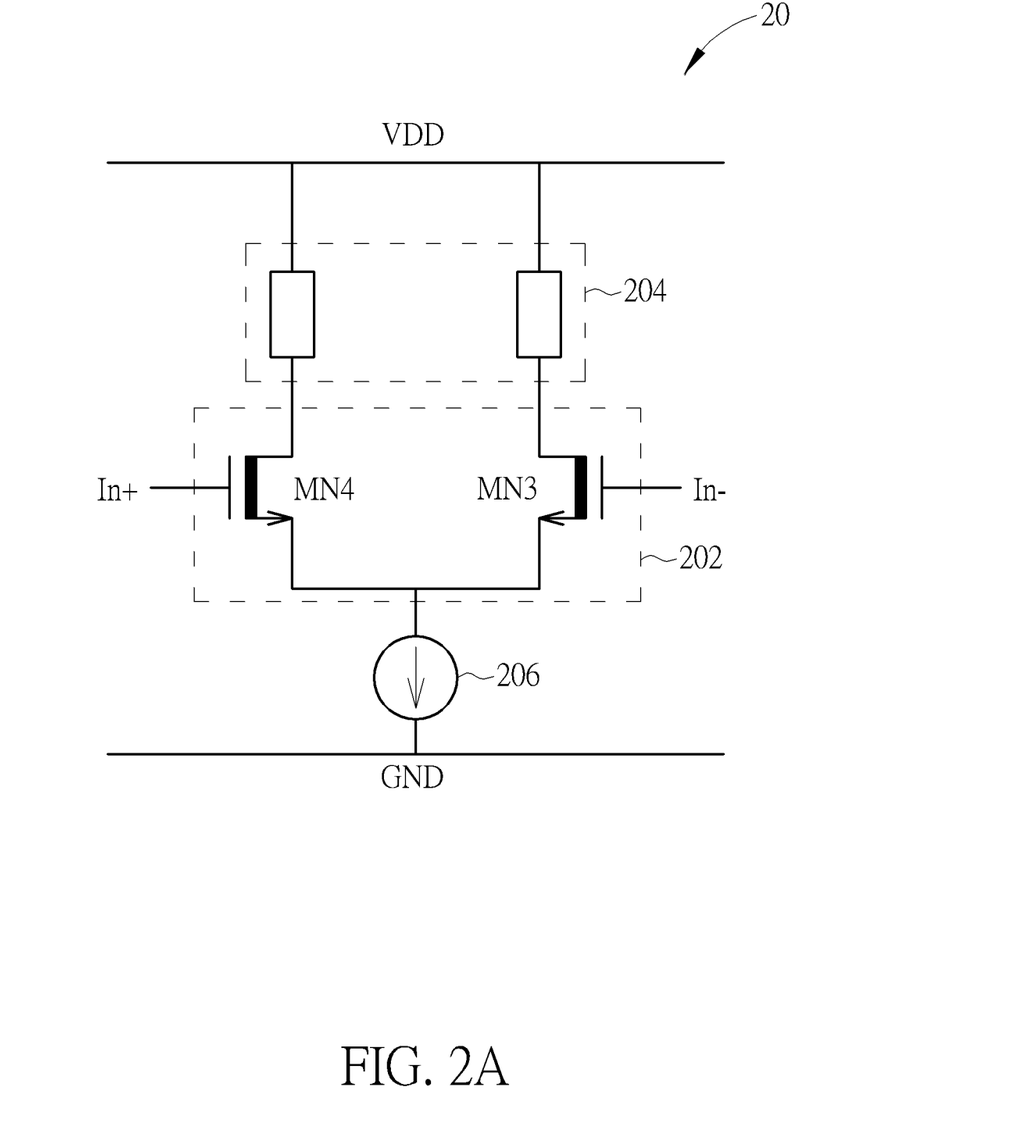
FIG. 2A is a schematic diagram of a part of an operational amplifier according to an embodiment of the present invention.

Please refer to FIG. 2A, which is a schematic diagram of apart of an operational amplifier 20 according to an embodiment of the present invention. As shown in FIG. 2A, the operational amplifier 20 includes an input pair 202, an active loads 204 and a bias source 206, wherein the N-channel input pair 202 includes N-channel metal-oxide-semiconductor field effect transistors (MOSFETs) MN3, MN4. In short, the MOSFETs MN3, MN4 respectively receives input voltages In−, In+ at respective gates, and a source of the MOSFET MN4 is coupled to a source of the MOSFET MN3. The active load 204 is coupled between drains of the MOSFETs MN3, MN4. The bias source 206 is coupled to between a first specific voltage level (i.e. aground voltage level GND) and sources of the MOSFETs MN3, MN4, wherein the MOSFETs MN3, MN4 are depletion-type.

In such a situation, if the MOSFET MN4 is intended to be turned on, the input voltage In+ minus a threshold voltage of the transistor the MOSFET MN4 and a turned on voltage VDsat of the bias source 206 should be greater than a ground voltage level GND, i.e. 0V, but since the MOSFET MN4 is depletion-type and the threshold voltage is a negative value, the MOSFET MN4 still can be turned on even if the input voltage In+ is 0 (e.g. the threshold voltage is −0.7V and the turned on voltage VDsat is 0.3V, and the MOSFET MN4 can be turned on when (In+)−(−0.7)−0.3>0). The MOSFET MN3 requires the same operating condition. Therefore, the operational amplifier 20 can be turned on in a range CMN and achieve a rail to rail output voltage. As a result, by utilize the depletion-type MOSFETs MN3, MN4 as the input pair 202, the operational amplifier 20 can utilize only one input pair 202 to achieve the rail to rail output voltage and thus reduce circuit area.

Figure 2B:
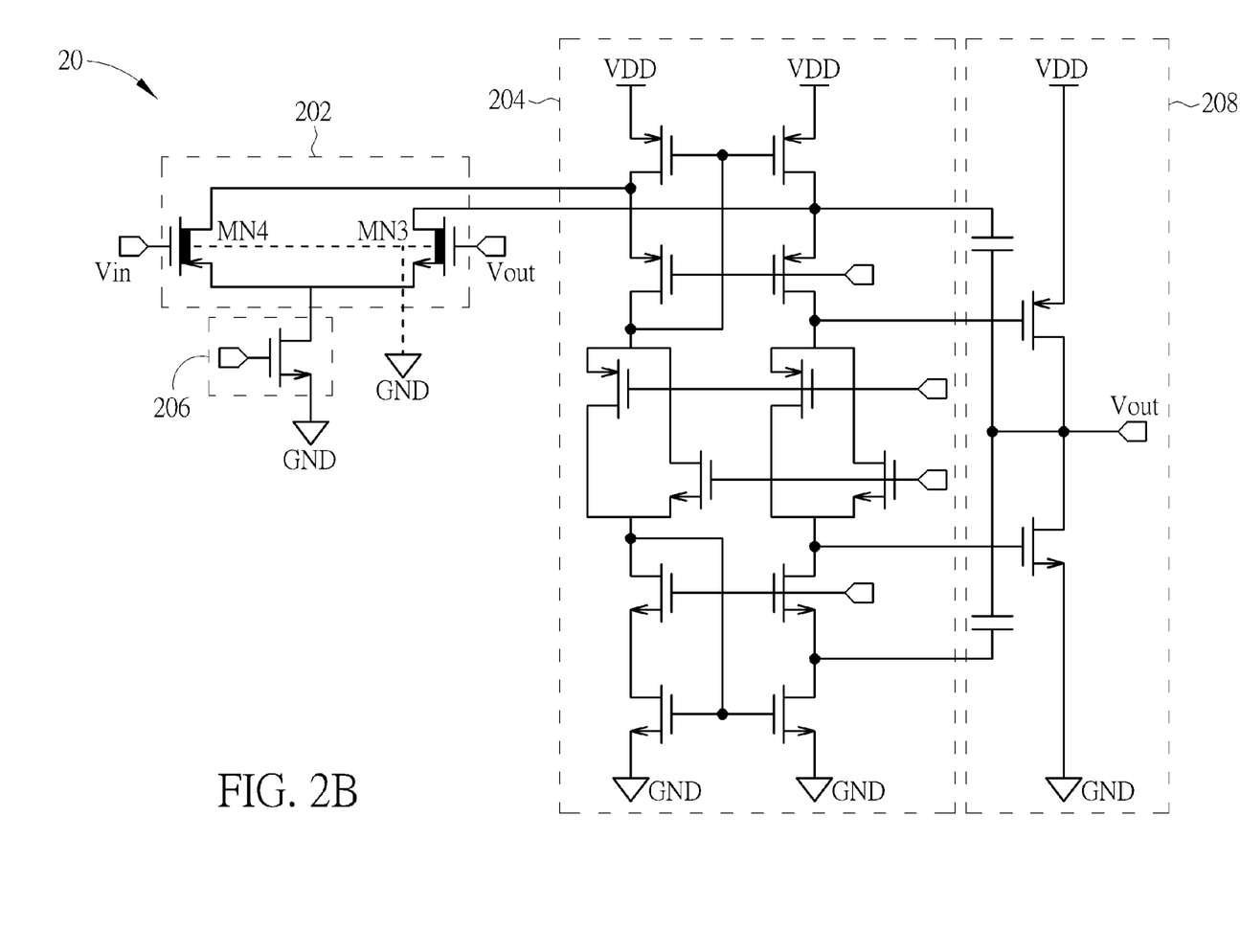
FIG. 2B is a detailed schematic diagram of the operational amplifier shown in FIG. 2A.

Noticeably, the spirit of the above embodiment is to utilize depletion-type MOSFETs as an input pair, and can utilize only one input pair achieve a rail to rail output voltage and reduce circuit area. Those skilled in the art can make modifications or alterations accordingly. For example, detailed circuits of the operational amplifier 20 are not limited to any specific structure. Please refer to FIG. 2B, which is a detailed schematic diagram of the operational amplifier 20 shown in FIG. 2A. As shown in FIG. 2B, the operational amplifier 20 further includes an output stage 208, coupled to the active load 204, to generate an output voltage Vout, wherein the bias source 206 is implemented by a bias transistor. Under such a structure, the input voltages In−, In+ respectively received at gates of the MOSFETs MN3, MN4 can be the output voltage Vout and an input voltage Vin, to maintain the output voltage Vout at a level of the input voltage Vin by negative feedback, and the active load 204 is realized by a folded structure as a transconductor, to provide a currents to the N-channel input pair 202 to generate voltage signals such that output stage 208 can generate the output voltage Vout. Noticeably, the active load 204, the bias source 206 and the output stage 208 are not limited to the structure shown in FIG. 2B, and can be other structures with the same functions.

Besides, bodies of the MOSFETs MN3, MN4 can be coupled to a second specific voltage level, and the second specific voltage level can be equal to the first specific voltage level (e.g. the bodies of the MOSFETs MN3, MN4 of are coupled to the ground voltage level GND as shown in FIG. 2B) or between the first specific voltage level and a voltage level of the sources of the MOSFETs MN3, MN4 (e.g. the bodies of the MOSFETs MN3, MN4 can be coupled to a voltage level greater than 0 but less than the voltage level of the sources of the MOSFETs MN3, MN4). In such a situation, since a voltage difference between the sources and the bodies of the MOSFETs MN3, MN4 is greater than 0, when the gate voltages of the MOSFETs MN3, MN4 (i.e. the output voltage Vout and the input voltage Vin) increase, the threshold voltage of the MOSFETs MN3, MN4 changes from a negative value to close to 0 or even a positive value, which facilitates the operational amplifier 20 to output an output voltage Vout with a high voltage level.

Figure 3A:
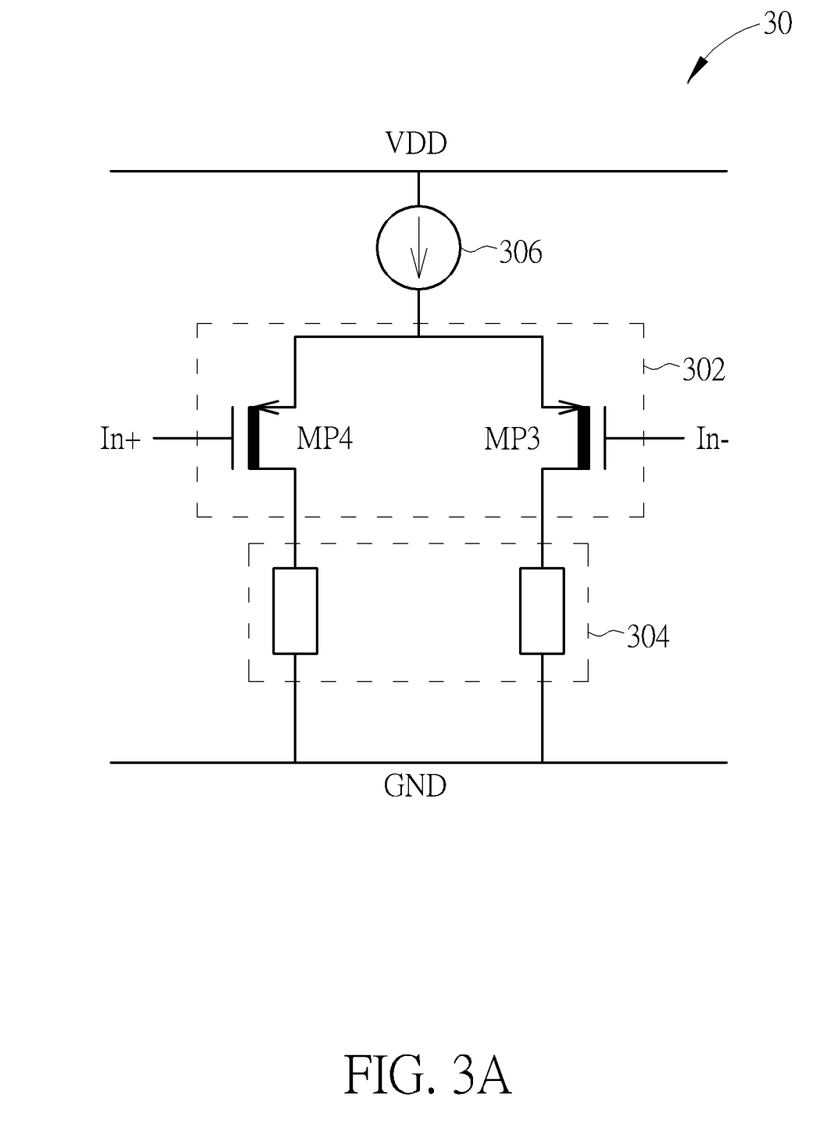
FIG. 3A is a schematic diagram of a part of another operational amplifier according to an embodiment of the present invention.

In addition, the above embodiment utilizes the N-channel MOSFETs MN3, MN4 as the input pair 202, but other embodiments can utilize P-channel MOSFETs as an input pair. For example, Please refer to FIG. 3A and FIG. 3B. FIG. 3A is a schematic diagram of a part of an operational amplifier 30 according to an embodiment of the present invention. As shown in FIG. 3A, the operational amplifier 30 includes an input pair 302, an active load 304 and a bias source 306, wherein the P-channel input pair 302 includes P-channel MOSFETs MP3, MP4. In short, MOSFET MP3, MP4 respectively receives input voltages In−, In+ at respective gates, and a source of the MOSFET MP4 is coupled to a source of the MOSFET MP3. The active load 304 is coupled between drains of the MOSFETs MP3, MP4. The bias source 306 is coupled to between a first specific voltage level (i.e. system voltage VDD) and sources of the MOSFETs MP3, MP4, wherein the MOSFETs MP3, MP4 are depletion-type.

In such a situation, if the MOSFET MP4 is intended to be turned on, the input voltage In+ minus a threshold voltage of the transistor the MOSFET MN4 and a turned on voltage VDsat of the bias source 206 should be greater than a ground voltage level GND, i.e. 0V, a system voltage VDD minus a turned on voltage VDsat of the bias source 306 and an inverse number of a threshold voltage of the transistor MP4 need to be greater than the input voltage In+, but since the MOSFET MP4 is depletion-type and the threshold voltage is positive value (i.e. the threshold voltage of the P-channel enhancement-type transistor is a gate-to-source voltage and a positive value, and thus a source-to-gate voltage VSG need to be greater than the inverse number of the threshold voltage for the P-channel enhancement-type transistor to be turned on), the MOSFET MP4 still can be turned on even if the input voltage In+ is close to the system voltage VDD (e.g. threshold voltage is 0.7V and the turned on voltage VDsat is 0.3V, and the transistor MP4 can be turned on when VDD−0.3−(−0.7)>(In+)). The MOSFET MP3 requires the same operating condition. Therefore, the operational amplifier 30 can be turned on in a range CMP and achieve a rail to rail output voltage. As a result, by utilize the depletion-type MOSFETs MP3, MP4 as the input pair 302, the operational amplifier 30 can utilize only one input pair 302 to achieve the rail to rail output voltage and thus reduce circuit area.

Figure 3B:
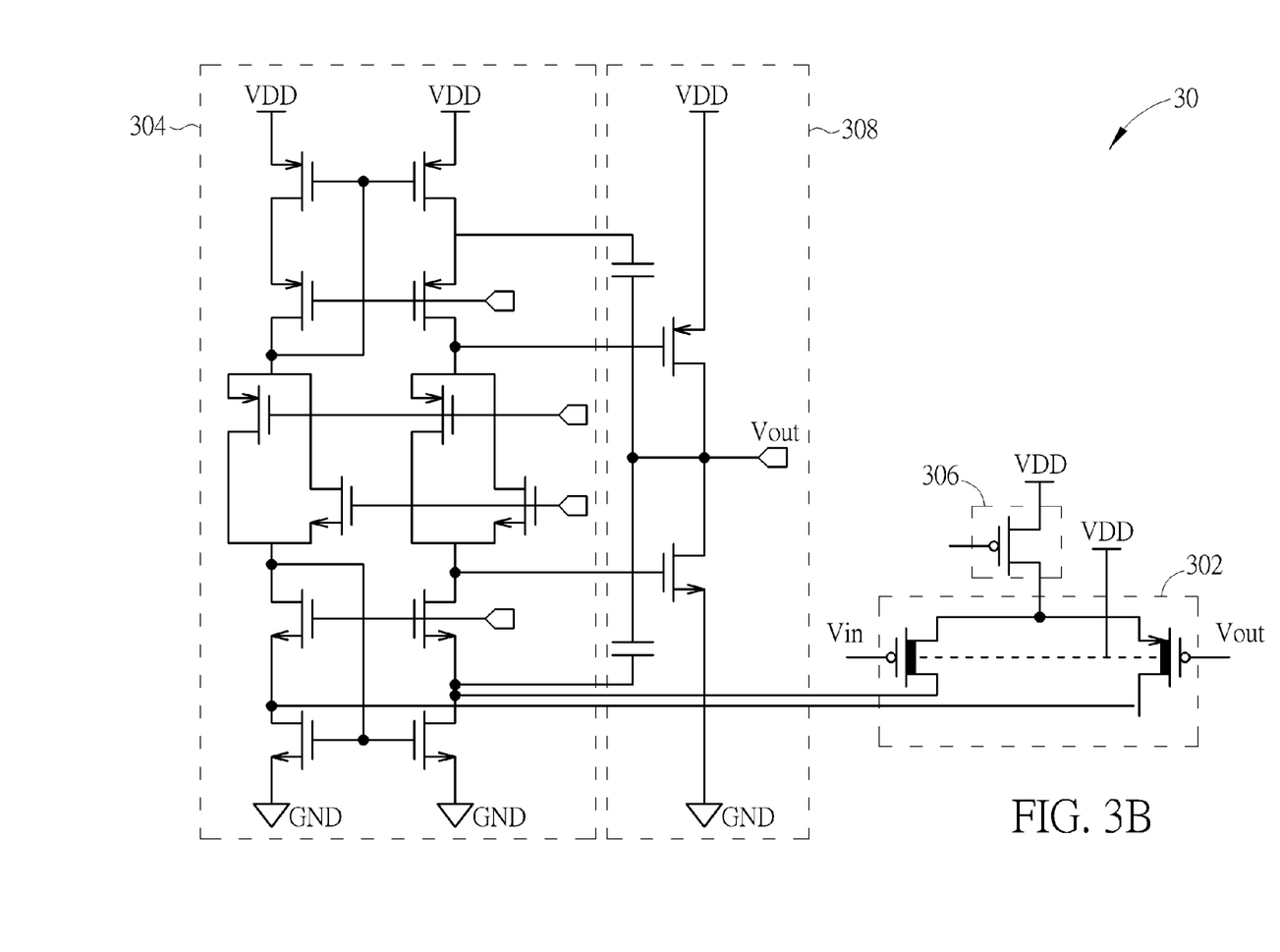
FIG. 3B is a detailed schematic diagram of the operational amplifier shown in FIG. 3A.

On the other hand, please refer to FIG. 3B, FIG. 3B is a detailed schematic diagram of the operational amplifier 30 shown in FIG. 3A. As shown in FIG. 3B, the operational amplifier 30 further includes an output stage 308, coupled to the active load 304, to generate an output voltage Vout, wherein the bias source 306 is implemented by a bias transistor. Under such a structure, the input voltages In−, In+ respectively received at gates of the MOSFETs MP3, MP4 can be the output voltage Vout and an input voltage Vin, to maintain the output voltage Vout at a level of the input voltage Vin by negative feedback, and the active load 304 is realized by a folded structure as a transconductor, to provide a currents to the P-channel input pair 302 to generate voltage signals such that output stage 308 can generate the output voltage Vout. Noticeably, the active load 304, the bias source 306 and the output stage 308 are not limited to the structure shown in FIG. 3B, and can be other structures with the same functions.

Besides, bodies of the MOSFETs MP3, MP4 can be coupled to a second specific voltage level, and the second specific voltage level can be equal to the first specific voltage level (e.g. the bodies of the MOSFETs MP3, MP4 of are coupled to the system voltage VDD as shown in FIG. 3B) or between the first specific voltage level and a voltage level of the sources of the MOSFETs MP3, MP4 (e.g. the bodies of the MOSFETs MP3, MP4 can be coupled to a voltage level less than the system voltage VDD but greater than the voltage level of the sources of the MOSFETs MP3, MP4). In such a situation, since a voltage difference between the sources and the bodies of the MOSFETs MOSFET MP3, MP4 is greater than 0, when the gate voltages of the MOSFETs MN3, MN4 (i.e. the output voltage Vout and the input voltage Vin) decrease, the threshold voltage of the MOSFETs MP3, MP4 changes from a positive value to close to 0 or even a negative value, which facilitates the operational amplifier 30 to output an output voltage Vout with a low voltage level.

Figure 4:
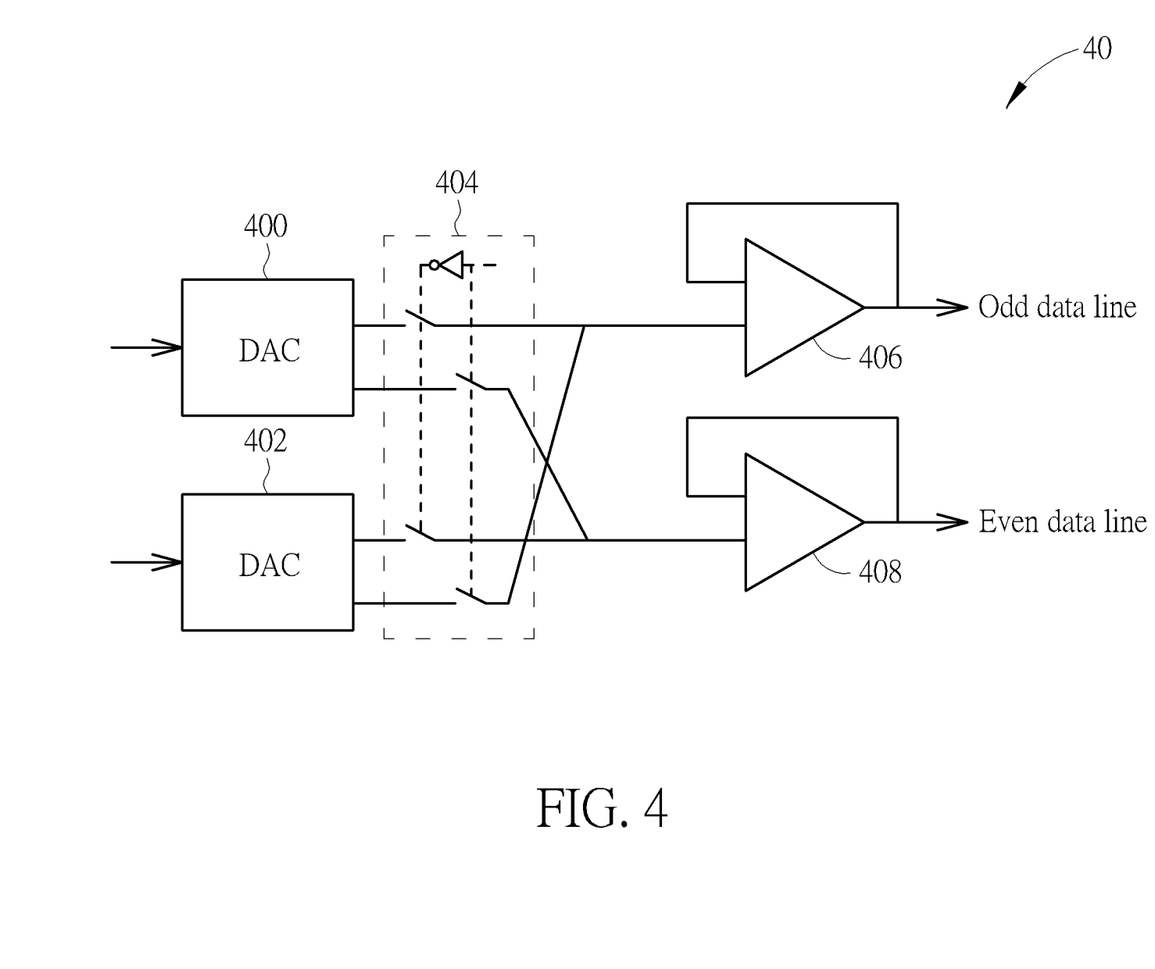
FIG. 4 is a schematic diagram of an LCD driver according to an embodiment of the present invention.
Figure 5:
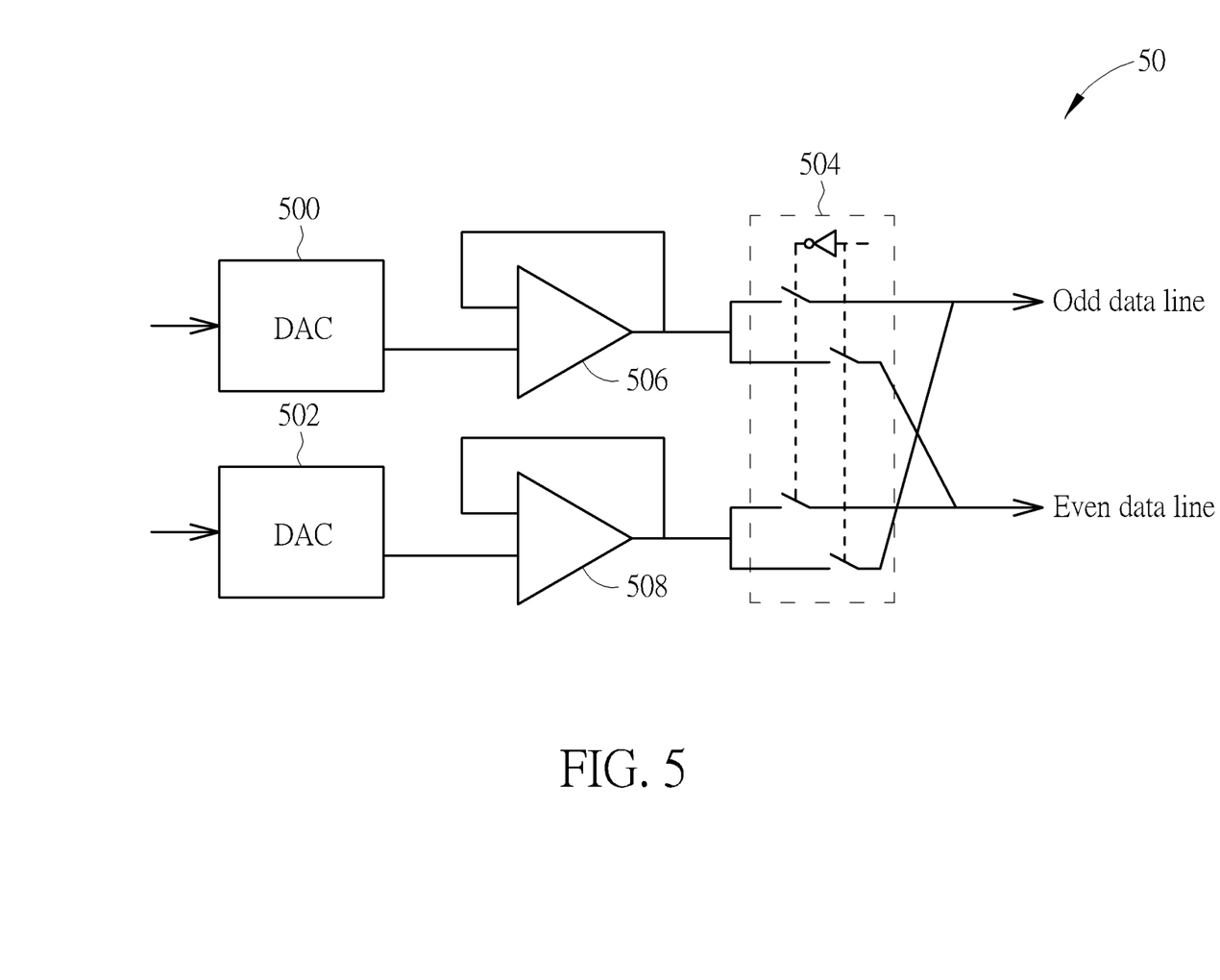
FIG. 5 is a schematic diagram of another LCD driver according to an embodiment of the present invention.

Moreover, the operational amplifiers 20, 30 can be utilized for output a rail to rail output voltage Vout, and thus can be utilized in a liquid crystal display (LCD) driver as an output buffer. For example, please refer to FIG. 4 and FIG. 5. FIG. 4 is a schematic diagram of an LCD driver 40 according to an embodiment of the present invention, and FIG. 5 is a schematic diagram of another LCD driver 50 according to an embodiment of the present invention. As shown in FIG. 4, the LCD driver 40 includes digital to analog converters (DACs) 400, 402, a switch circuit 404 and operational amplifiers 406, 408. In short, the DACs 400, 402 receive digital signals to output positive voltages and negative voltages, respectively, and then the switch circuit 404 switches connections between the DACs 400, 402 and the operational amplifiers 406, 408 to alternatively output positive voltages and negative voltages to the operational amplifiers 406, 408 (i.e. the operational amplifiers 406, 408 receive positive negative voltages and negative voltages, respectively, and after polarity changes, the switch circuit 404 switches connection configuration such that the operational amplifiers 406, 408 receive negative voltages and positive voltages, respectively), such that the operational amplifiers 406, 408 can stably generate output voltages for an odd data line and an even data line to drive liquid crystals according to received input voltages. Noticeably, each of the operational amplifiers 406, 408 can be realized by one of the operational amplifier 20, 30 to output a rail to rail output voltage and thus reduce circuit area.

On the other hand, as shown in FIG. 5, the LCD driver 50 includes DACs 500, 502, a switch circuit 504 and operational amplifiers 506, 508. In short, the DACs 500, 502 receive digital signals to output positive voltages and negative voltages, respectively, the operational amplifiers 506, 508 stably generate output voltages according to received input voltages, and then the switch circuit 504 switches connections between the switch operational amplifiers 506, 508 and an odd data line and an even data line, to alternatively output positive output voltages and negative output voltages to drive liquid crystals (i.e. the operational amplifiers 506, 508 output positive output voltages and negative output voltages to the odd data line and the even data line, respectively, and after polarity changes, the switch circuit 504 switches connection configuration such that the operational amplifier 506, 508 output positive output voltage and negative output voltage to the odd data line and the even data line, respectively). Noticeably, each of the operational amplifiers 506, 508 can be realized by one of the operational amplifier 20, 30 to output a rail to rail output voltage and thus reduce circuit area. Besides, the operational amplifiers 20, 30 can also be utilized in other circuits, and are not limited to an LCD driver.

In the prior art, the operational amplifier 10 needs to include both the P-channel input pair 100 and the N-channel input pair 102, and requires larger circuit area. In comparison, the above embodiments utilize depletion-type MOSFETs as an input pair, and can utilize only one input pair achieve a rail to rail output voltage and reduce circuit area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operational amplifier, comprising:
   a first metal-oxide-semiconductor field effect transistor (MOSFET), comprising a first drain, a first gate and a first source;
   a second MOSFET, comprising a second drain, a second gate and a second source, the second source coupled to the first source of the first MOSFET; and
   a bias source, coupled between a first specific voltage level and the first source of the first MOSFET and the second source of the second MOSFET;
   wherein the first MOSFET and the second MOSFET are depletion-type;
   wherein a first body of the first MOSFET and a second body of the second MOSFET are coupled to a second specific voltage level, and the second specific voltage level is equal to the first specific voltage level or between the first specific voltage level and a voltage level of the first source of the first MOSFET and the second source of the second MOSFET;
   wherein the first MOSFET and the second MOSFET are N-channel MOSFETs, and the first specific voltage level is a ground voltage level.

2. The operational amplifier of claim 1 further comprising:
   an active load, coupled to the first drain of the first MOSFET and the second drain of the second MOSFET; and
   an output stage, coupled to the active load, for generating an output voltage.

3. The operational amplifier of claim 1, wherein the operational amplifier is utilized in a Liquid Crystal Display (LCD) driver.

* * * * *